(12) United States Patent
Lee et al.

(10) Patent No.: US 6,610,557 B2
(45) Date of Patent: Aug. 26, 2003

(54) CMOS IMAGE SENSOR AND A FABRICATION METHOD FOR THE SAME

(75) Inventors: Seo Kyu Lee, Chungchongbuk-do (KR); Hang Kyoo Kim, Taegu-Kwangyokshi (KR); Jung Soon Shin, Kyonggi-do (KR)

(73) Assignee: Hynix Semiconductor Inc., Kyonggi-Do (KR)

( * ) Notice: Subject to any disclaimer, the term of this patent is extended or adjusted under 35 U.S.C. 154(b) by 0 days.

(21) Appl. No.: 10/152,043

(22) Filed: May 22, 2002

(65) Prior Publication Data

US 2002/0140009 A1 Oct. 3, 2002

Related U.S. Application Data

(62) Division of application No. 09/712,195, filed on Nov. 15, 2000, now Pat. No. 6,433,373.

(30) Foreign Application Priority Data

Apr. 28, 2000 (KR) ........................................ 2000-22855

(51) Int. Cl.[7] .............................................. H01L 21/00
(52) U.S. Cl. .............................. 438/87; 438/60; 438/75; 438/527
(58) Field of Search ............................. 438/60, 75, 87, 438/90, 527

(56) References Cited

U.S. PATENT DOCUMENTS

| | | | |
|---|---|---|---|
| 4,238,760 A | 12/1980 | Carr | 257/292 |
| 5,446,297 A | * 8/1995 | Lee | 257/223 |
| 5,625,210 A | 4/1997 | Lee et al. | 257/292 |
| 6,026,964 A | 2/2000 | Hook et al. | 257/292 |
| 6,218,691 B1 | 4/2001 | Chung et al. | 257/290 |
| 6,281,533 B1 | * 8/2001 | Miyagawa et al. | 257/290 |
| 6,441,411 B2 | * 8/2002 | Nozaki et al. | 257/292 |
| 6,465,862 B1 | * 10/2002 | Harris | 257/463 |
| 6,504,193 B1 | * 1/2003 | Ishiwata et al. | 257/291 |

* cited by examiner

*Primary Examiner*—Trung Dang
(74) *Attorney, Agent, or Firm*—Birch, Stewart, Kolasch & Birch, LLP

(57) ABSTRACT

The present invention relates to a CMOS image sensor and a fabrication method thereof. The sensor has a photo diode region being extended to a lower portion of an active region in which a transfer gate, sensing gate and reset gate are formed and therefrom the sensitivity of the CMOS image sensor is enhanced. The sensor of the present invention includes a unit cell region having a first region and a second region adjacent to the first region, a PDN region having a first PDN region which is extended from the surface in the first region into the bulk in a direction perpendicular to the surface in an accompanying drawing and a second PDN region which is extended from the lower portion of the first PDN region into the lower portion of the second region in a horizontal direction in the accompanying drawing, and a floating diffusion region and a reset region which are formed in a surface of the second region above the second PDN region.

10 Claims, 7 Drawing Sheets

CMOS IMAGE SENSOR AND A FABRICATION METHOD FOR THE SAME

This application is a divisional of application Ser. No. 09/712,195, filed on Nov. 15, 2000, now U.S. Pat. No. 6,433,373, the entire contents of which are hereby incorporated by reference and for which priority is claimed under 35 U.S.C. §120; and this application claims priority of Application No. P2000-22855 filed in Korea on Apr. 28, 2000 under 35 U.S.C. §119.

BACKGROUND OF THE INVENTION

1. Field of the Invention

The present invention relates to a CMOS image sensor, more particularly, to a CMOS image sensor and a fabrication method thereof comprising a photo diode region that is expanded over all the lower portion of an active region where a transfer gate is formed so as to enhance the sensitivity of the sensor and that has different potential level according to a position in the photo diode region.

2. Discussion of the Related Art

Recently, the functions of most electronic productions are versatile. For instance, a personal computer is equipped with a compact disk-read only memory (CD-ROM) driver, a digital versatile disk (DVD) player, or a camera for a video conference. Also, for editing pictures by using a computer, digital cameras attached to computers are commonly for sale. Even a notebook computer and a cellular phone having a small size camera mounted within them will be put in large quantities on a market soon.

Attaching a camera to a large size product like personal computer does not cause any troubles in using it. However, portable products of small size such as a notebook computer or a cellular phone will have serious problems in case of being attached with a camera since a typical product uses a charge coupled device as an image sensor (a photosensitive device). But the charge coupled device (CCD) consumes a large power and therefore a large cell has to be used for the camera.

Most CCD devices that have been already developed are driven by higher voltage (+15 to −9V) than a CMOS circuit and a fabrication process of the CCD devices are basically similar to a fabrication process of bipolar transistor. Therefore, the cost for fabricating the CCD devices is much higher than the case for the CMOS.

In order to solve a such a problem, a study on implementing and producing CMOS image sensors has been done to realize the CCD image sensors being operated by a low voltage and a low power consumption as well as having a low production cost.

A conventional CMOS image sensor will be described as follows by referring to the accompanying drawings.

FIG. 1 is a cross sectional view of 3 transistor (TR) pixel structure of a conventional CMOS image sensor and FIG. 2 is a circuit configuration of the 3 TR pixel of the conventional CMOS image sensor.

FIG. 1 shows a cross sectional view of a three transistor pixel structure of a conventional CMOS image sensor. Since a standard CMOS process is conventionally applied to a CMOS image sensor, an n type well 102 is formed in a p type semiconductor substrate 100 to form a light receiving portion.

In order to sense image charges generated in the light receiving portion, a p type well 101 is formed adjacent to said n type well 102.

A n+ region 103a is extended from the surface of the n type well 102 to a portion of the surface of the p type well 101.

The n+ region 103a is used as a channel to move the image charges.

An n+ region 103b is formed in a portion of the surface of the p type well region 101 spaced apart from the n+ region 103a and is used as a floating region in which sensing operation for the image charges is performed.

Next, a transfer gate 104 for transferring the charges is formed over the substrate between the n+ region 103a and the n+ region 103b.

FIG. 2 shows a circuit configuration of a three transistor (TR) pixel structure of a conventional CMOS image sensor. The circuit of 3 TR pixel structure is constructed with a reset transistor 1, a select transistor 4 and an access transistor 7.

The reset transistor 1 has a gate to receive a reset signal through a signal input terminal 2, one electrode connected to a floating node 5 and the other electrode connected to a VDD terminal 3. The select transistor 4 has a gate connected to the floating node 5 and one electrode connected to the VDD terminal 3. The other electrode of the select transistor 4 is connected to the access transistor 7. The access transistor 7 is connected in series between the select transistor 4 and a column select line 9. The gate of the access transistor 7 is connected to a row select signal input terminal 8 so as to receive a row select signal. A photo diode 6 is connected between said floating node 5 and a ground terminal 10.

The sensing operation of the 3TR of the conventional CMOS image sensor is described as follows.

Image charges that are induced by incident light from outside to a photo diode 6 are accumulated in the photo diode 6. The accumulated signal charges therein change a potential of the floating node 5 which is used as a source terminal of the reset transistor 1 and therefrom change the gate potential of the select transistor 4 which is used as a driver of a pixel level source follower. The change of the gate potential of the select transistor 4 causes the bias of the node for a drain of the access transistor 7 and a source of the select transistor 4 to be changed.

Thus, while signal charges are accumulated in the photo diode 6, potentials at the sources of the reset and select transistors 1 and 4 are changed. At this time, if a row select signal is applied to the gate of the access transistor 7 through a row select signal input terminal 8, then a potential difference due to the signal charges generated in the photo diode 6 is transferred to a column select line 9.

After the signal level due to the signal charges generated in the photo diode 6 is detected, the reset transistor 1 is turned on by the reset signal received through the reset signal input terminal 2 and all the signal charges accumulated in the photo diode 6 are reset.

In order to solve the noise problem of the conventional CMOS image sensors of 3 TR pixel structure, a CMOS image sensor of 4 TR pixel structure has been studied and is described as follows.

FIG. 3 is a cross sectional diagram showing a conventional CMOS image sensor of a 4 TR pixel structure and FIG. 4 is a circuit configuration of the 4 TR pixel structure of the conventional image sensor.

As shown in FIG. 3, a p-type epitaxial layer 301 is formed on a p-type semiconductor substrate 300 and an n type well region 302 is formed in a portion of said p-type epitaxial layer 301.

In a portion of the surface of the p-type epitaxial layer 301, a photo diode region consists of an n+ impurity doped layer 303 in the p-type epitaxial layer 301 and a p+ surface impurity layer 307 formed on a surface of the impurity doped layer 303.

A n+ region 304 is formed in a portion of a p-type epitaxial layer 301 spaced apart from the photo diode region. The n+ region is used as a floating diffusion region for sensing image charges.

Another n+ region 309 is formed in a p type epitaxial layer 301 spaced apart from the n+ region 304 and is connected to a power supply voltage VDD.

A lightly doped n-type impurity layer 308 is formed in a surface of the p-type epitaxial layer 301 between the photo diode region 303 and 307 and the n+ region 304, and a transfer gate 305 is formed over the lightly doped n-type impurity layer 308.

Next, a reset gate 306 is formed over the surface of the epitaxial layer 301 between the n+ region 304 and the n+ region 309.

A circuit configuration and a charge sensing operation of the conventional CMOS image sensor of 4 TR pixel structure will be described as follows by referring to FIG. 4.

The circuit of 4 TR pixel structure is constructed with a reset transistor 21, a select transistor 24, an access transistor 30, a transfer transistor 29 and a photo diode 27.

The reset transistor 21 has a gate receiving a reset signal through a reset signal input terminal 22. One electrode of the reset transistor 21 is connected to a floating node 25 and the other electrode of the reset transistor 21 is connected to a VDD terminal 23. The select transistor 24 has a gate connected to the floating node 25. One electrode of the select transistor 24 is connected to the VDD terminal 23. The other electrode of the select transistor 24 is connected to the access transistor 30.

The gate of the access transistor 30 is connected to a row select signal input terminal 31 so as to receive a row select signal.

The other electrode of the access transistor 30 is connected to a column select line 32.

The transfer transistor 29 has a gate connected to a transfer signal input terminal 28. One electrode of the transfer transistor 29 is connected to the floating node 25 and the other electrode is connected to a photo diode 27. When reading the accumulated charges, the transfer transistor 29 performs an operation transferring image charges.

The photo diode 27 has the other electrode connected to a ground 10 and a photo gate 26. When transferring the charges, the photo gate 26 performs an operation collecting the accumulated charges upon the surface.

The sensing operation of the conventional CMOS image sensor of the 4 TR pixel structure will be described as follows.

First, image charges induced via incident light are accumulated in the photo diode 27.

The accumulated signal charges are collected on the surface of the photo diode 27 when the bias of the photo gate 26 is changed to a high level. At this time, if a transfer signal inputted to the gate of the transfer transistor 29 makes the transistor 29 turned on, a signal level is transmitted to a floating node 25.

In addition to this state, if the reset transistor 21 is holding a OFF state, a potential level of the floating node 25 which is used as a source terminal of the reset transistor 21 is changed in accordance with the signal charges accumulated in the floating node 25. Therefore, the gate potential of the select transistor 24 is changed.

The change of the gate potential of the select transistor 24 causes the bias of a source terminal of the select transistor 24 to be changed and therefrom the bias of a drain of the access transistor 30 to be changed.

In this case, if a row selection signal is applied to the gate of the access transistor 30 through a row selection signal input terminal 31, then a potential due to the signal charges generated at the photo diode 27 is transmitted to the column selection line 32.

As the result, after a signal level due to the charges generated at the photo diode 27 is detected, a reset transistor 21 is turned into an ON state by the reset signal received through the reset signal input terminal 22 and thereby all the signal charges are reset.

By repeating the aforementioned operations, each signal level as well as a reference potential after the reset operation is read out.

However, the CMOS image sensors in the conventional art still have problems such as follows.

Even though the photo diodes of the CMOS image sensor having a 3 TR pixel structure have a large light receiving region so as to improve a fill factor, an additional circuit is required to remove noises generated in the pixel level and therefore the pixel size is increased.

Furthermore, another serious problem is that the sensitivity is abruptly decreased because of a capacitance of the photo diode directly operating as an input capacitance.

By adopting the CCD technology for the CMOS image sensor of 4 TR pixel structure so as to solve such problem and to control the noise, the quality of the image of the sensor is improved since the charge transmission characteristic is improved. The sensitivity of the sensor adopting the CCD technology is also improved since the floating diffusion node has a low input capacitance. However, because of the use of the photo gate, the blue response characteristic and the fill factor are not so good.

Moreover, there is a possibility that an image lagging phenomenon due to the floating node arises.

Furthermore, the fabricating process is complicated because of forming the photo gate.

Therefore, the present invention is directed to solve these problems of the CMOS image sensors in the conventional art and has one object to provide a CMOS image sensor and a fabrication method for the same.

SUMMARY OF THE INVENTION

Therefore, the present invention is directed to solve these problems of the CMOS image sensors in the conventional art and has one object to provide a CMOS image sensor and a fabrication method for the same.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages in accordance with the purpose of the present invention, as embodied and broadly described, the CMOS image sensor according to the present invention comprises a unit cell region having a first region and a second region adjacent to the first region, both regions being defined on a semiconductor substrate; a PDN region (this "PDN region" designates the region to form a photo diode having n type doping on a p type well) having a first PDN region and a second PDN region, the first PDN region being extended from a surface of said first region to a bulk semiconductor in a direction perpendicular to the surface of the semiconductor and a second PDN region being extended from the lower portion of the first PDN region to the lower portion of the second region in a direction perpendicular to the first PDN region; and a floating diffusion region and a reset region, both regions being formed in a surface of the second region above said second PDN region in an accompanying drawing.

A fabrication method of the CMOS image sensor according to the present invention comprises the step of forming an epitaxial layer by epitaxially growing a surface of the semiconductor substrate so as to have a first region and a second region adjacent to the first region; the step of dividing said first and second regions into a plurality of subregions; the step of repeatedly performing a PDN impurity ion doping process once or as many times as the number of said plurality of subregions so as to establish a stepwise potential distribution in said PDN region, the stepwise potential distribution having a stepwise value according to the each position of said subregions; the step of forming transistors for transferring, sensing and resetting image charges generated in said second region; and the step of performing a PDN impurity ion doping process in the first region once more.

The CMOS image sensor in accordance with the present invention has effects as follows.

First, the sensor has an excellent sensitivity characteristic according to the wavelength of light since the PDN region is deeply formed in a depth direction by the ion doping process, as shown in FIG. 6b and FIG. 6c.

Second, the sensor has a reduced white defect that exists essentially in a photo diode structure since the PDN region is deeply formed.

Third, a light responding characteristic of the sensor is enhanced since a maximum photo diode region in a unit cell region is secured and the fill factor is increased.

The above and other objects, features and advantages of the present invention will be apparent from the following description of preferred embodiments of the invention with reference to the accompanying drawings.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

In reference with the accompanying drawings hereinafter, a CMOS image sensor and a fabrication method for the same in accordance with the present invention will be described in detail as follows.

Figure 1:
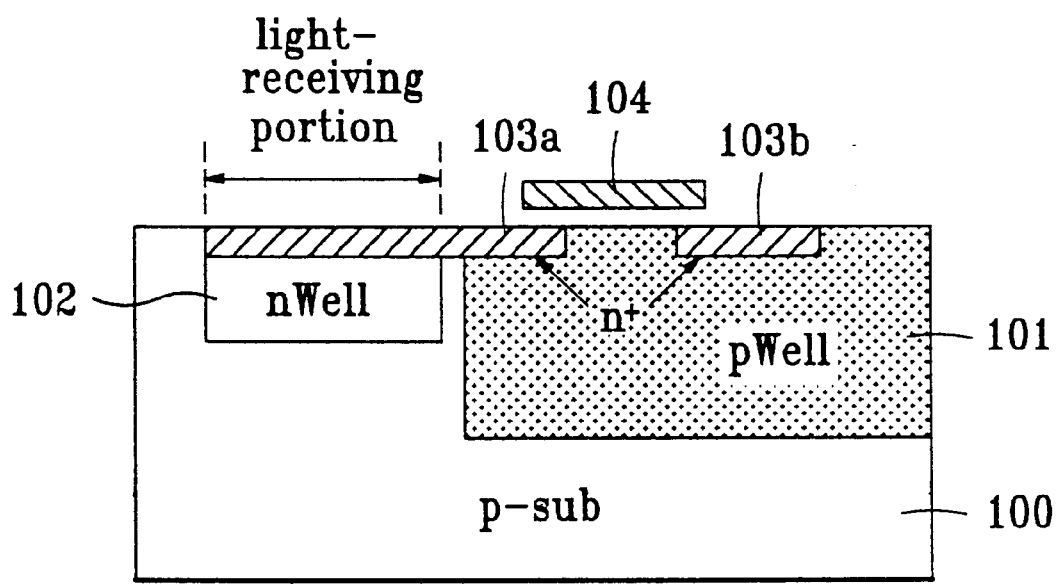
FIG. 1 is a cross sectional view of a three transistor pixel structure of a conventional CMOS image sensor.
Figure 2:
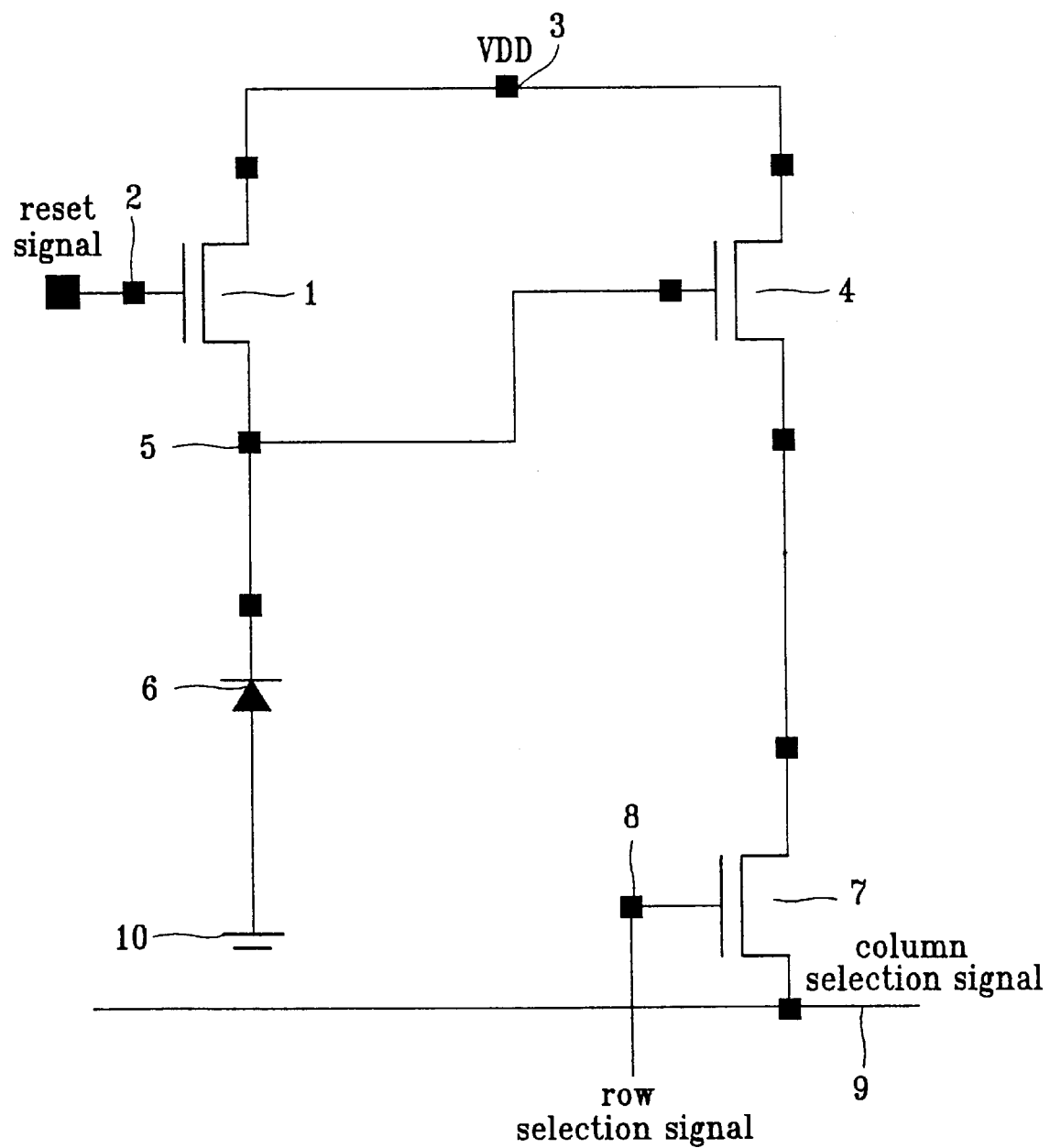
FIG. 2 is a circuit configuration diagram of the three transistor pixel structure of the conventional CMOS image sensor.
Figure 3:
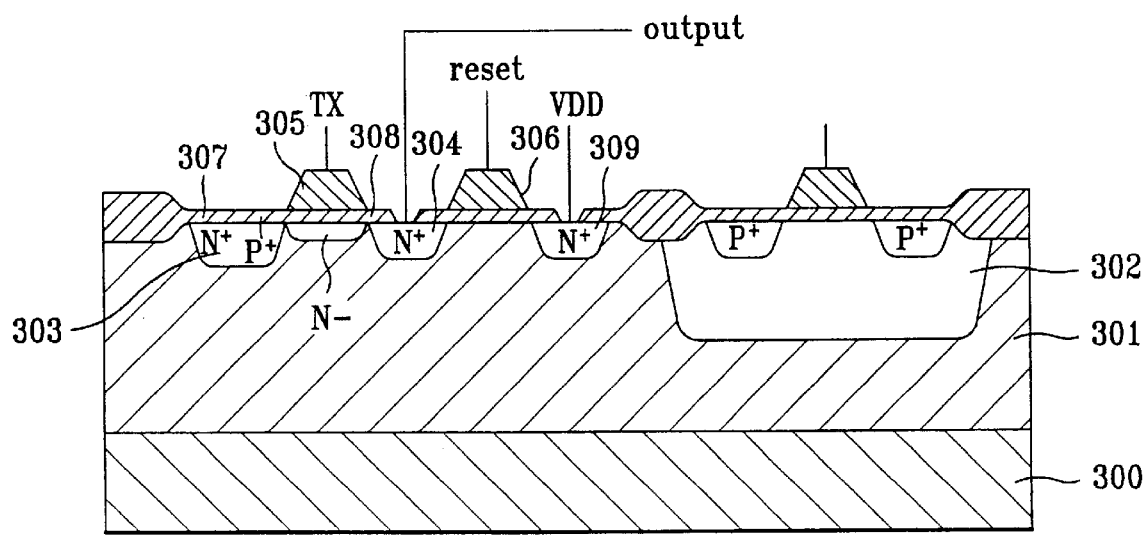
FIG. 3 is a cross sectional view of a four transistor pixel structure of a conventional CMOS image sensor.
Figure 4:
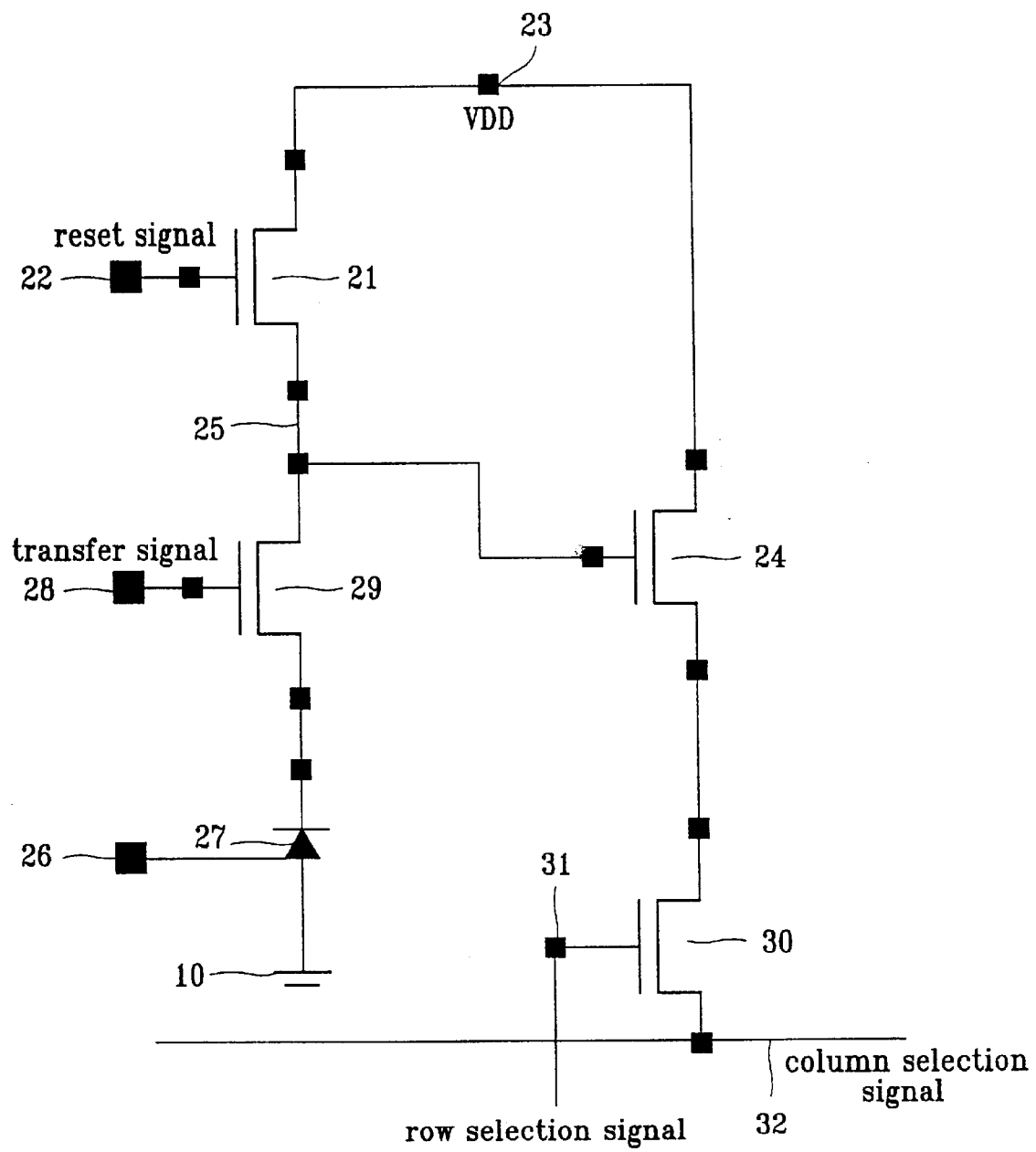
FIG. 4 is a circuit configuration diagram of the four transistor pixel structure of a conventional CMOS image sensor.
Figure 5:
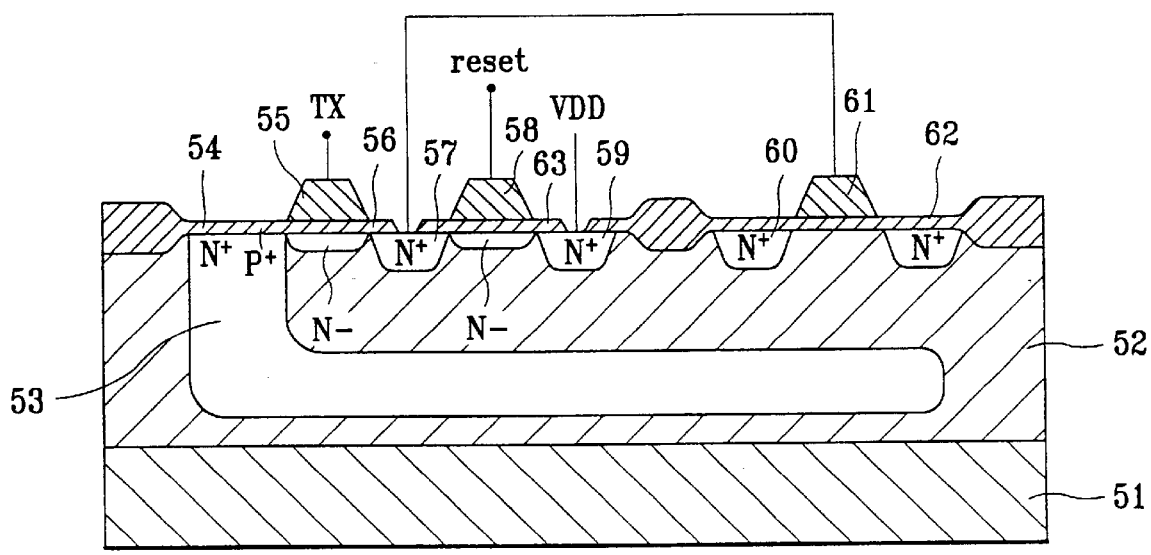
FIG. 5 is a cross sectional view of a pixel structure of a CMOS image sensor in accordance with the present invention.

FIG. 5 shows a cross sectional view of a pixel structure of CMOS image sensor according to one embodiment of the present invention.

Figure 6A:
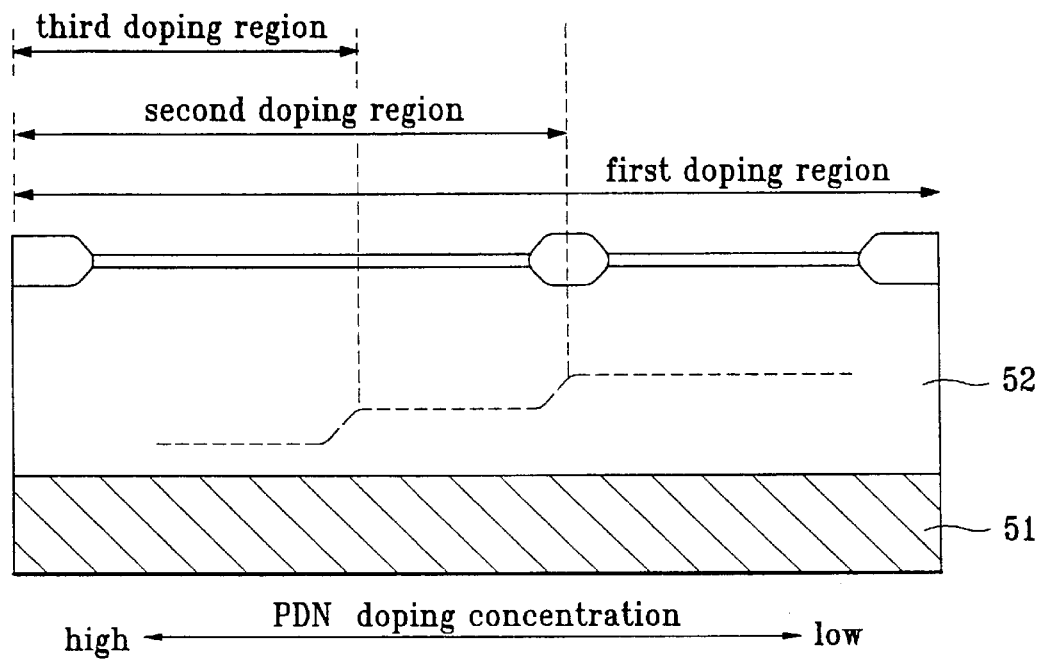
FIG. 6a and FIG. 6b are cross sectional views for showing a PDN ion doping process for the CMOS image sensor in accordance with another exemplary embodiment of the present invention.
Figure 6B:
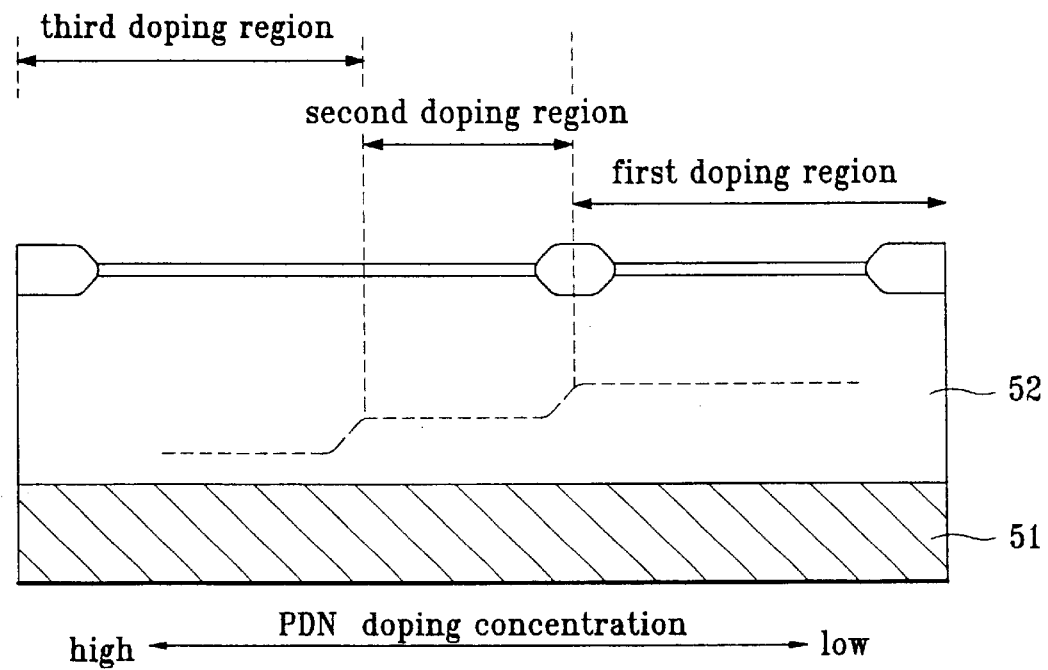
Figure 6C:
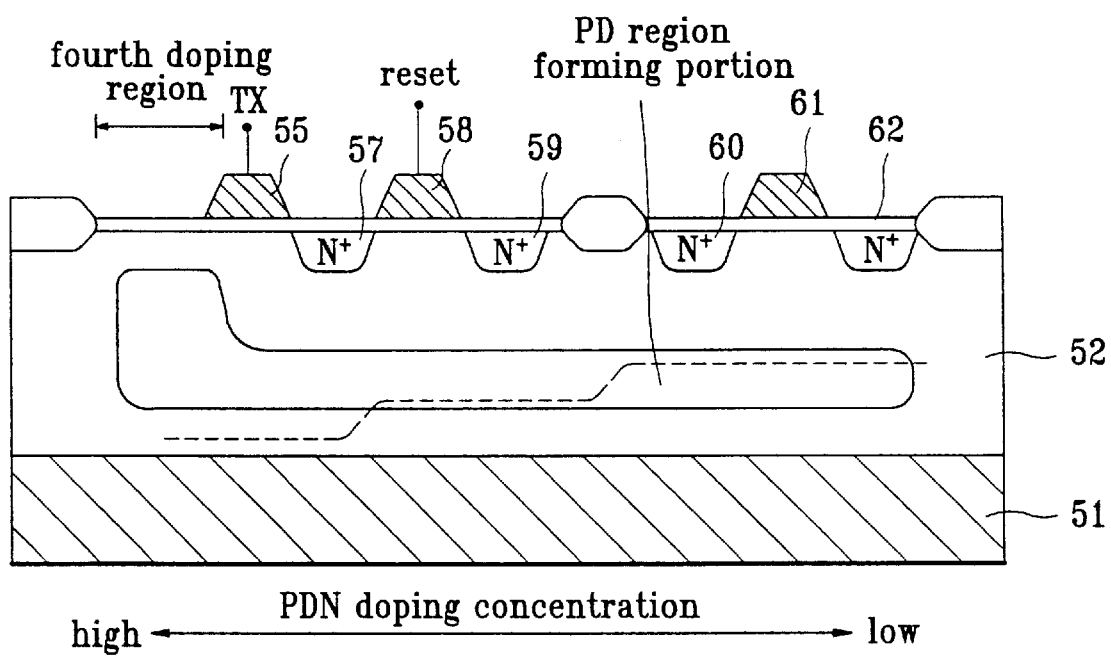
FIG. 6c is a cross sectional view of a pixel structure of a CMOS image sensor and a PDN ion doping process in accordance with the other exemplary embodiment of the present invention.

FIG. 6a to FIG. 6c show cross sectional views for the PDN impurity ion doping process of the CMOS image sensor according to the present invention.

The CMOS image sensor according to the present invention has a structure in which a PDN region is extended to a lower portion of an active region and is so deeply formed that a fill factor and a sensitivity are improved.

Therefore, it is possible for all light incident upon the whole surface of the sensor, to contribute to image charge generation. The whole surface includes the surface of the first and second regions except regions in which gates are formed and therefor act as a light shield.

Referring to FIG. 5, a unit cell structure of the CMOS image sensor according to the present invention will be described as follows.

A unit cell of CMOS image sensor according to one exemplary embodiment of the invention includes a p type epitaxial layer 52 that is formed on a p type semiconductor substrate 51 and that includes a first region in which a first PDN region is formed and a second region in which a second PDN region is formed. Both PDN regions will be explained later.

A PDN region 53 is formed in the epitaxial layer 52. The geometrical shape of the PDN region 53 is like a "L" in the cross sectional view for the embodiment as shown in FIG. 5. The first PDN region designates the vertical part of the PDN region 53 and the second PDN region designates the horizontal part of the PDN region 53. Therefore, the region of the epitaxial layer 52 including the first PDN region is defined as the first region and the region of the epitaxial layer 52 including the second PDN region is defined as the second region.

In this embodiment of the present invention, the first PDN region is formed from the surface of the first region into a bulk in a direction perpendicular to the surface and a second PDN region is extended from the lower portion of the first PDN region to the lower portion of the second region in a direction perpendicular to the first PDN region.

The PDN region 53 has a doped impurity concentration profile or a impurity doping depth stepwise decreased according to a horizontal distance from the first region as shown in FIG. 6a to FIG. 6c that will be explained in detail in an explanation about them. This is to establish a sloped potential distribution along the horizontal direction so that image charges are generated over the whole PDN region 53 but a charge transfer to an external electronic circuit is achieved in the first region.

As the result, image charges generated in the whole PDN region are collected in the first region because of the sloped potential distribution in the PDN region.

A surface heavily doped impurity region 54 is formed on the surface of said first PDN region in the first region by a p+ impurity ion doping process so as to suppress noises generated in the PDN region.

A first heavily doped impurity region 57 is formed in a part of the surface of the second region by an n+ impurity doping, spaced apart from said first PDN region by a predetermined distance. The region 54 is used as a diffusion region for sensing image charges.

A transfer gate 55 is formed on the semiconductor substrate between said first heavily doped impurity region 57 and the first PDN region.

A second heavily doped impurity region 59 is formed in a part of the surface of the second region by an n+ impurity doping, spaced apart from said first heavily doped impurity region 57 by a predetermined distance. The second heavily doped impurity region 59 is used as a reset region for resetting image charges when the image charges are detected in the floating diffusion region.

The reset gate 58 is formed in the semiconductor substrate between said first heavily doped impurity region 57 and the second heavily doped impurity region 59.

The select gate 61 is formed in an isolated region on the surface of the epitaxial layer 52 and connected to said first heavily doped impurity region 57.

A third heavily doped impurity region 60 and a fourth heavily doped impurity region 62 are respectively formed in the surface of the epitaxial layer 52 at each side of the select gate 61 and construct a select transistor.

Under said transfer gate 55 and said reset gate 58, a first lightly doped impurity regions 56 and a second lightly doped impurity regions 63 are formed by doping n− impurity ions.

Said second heavily doped impurity region 59 is connected with a power supply terminal VDD.

The structure of the CMOS image sensor according to the present invention can be applied to all image sensors of 3 TR and 4 TR structures.

A fabrication method of a CMOS image sensor according to the present invention is as follows.

First, by applying an epitaxial growing process on a surface of the p type semiconductor substrate 51, an epitaxial layer 52 is formed on a surface of the p type semiconductor substrate 51. If a well process instead of the epitaxial growing process depicted in the exemplary explanation of the present invention is used for fabricating the image sensor, it is possible to use an n type semiconductor substrate and a p type well region formed on the n type semiconductor substrate by doping p type impurity ions.

After the p type epitaxial layer or the p type well region is formed on the semiconductor substrate, an impurity ion doping process is performed for forming a PDN region in the unit cell region.

The impurity ion doping process is repeatedly performed by using a mask layer which is formed by a photolithography technology. Two methods for the ion doping are explained in the exemplary embodiments of the present invention.

Referring to FIG. 6a, a first method is described as follows. FIG. 6a shows an exemplary embodiment of the present invention in which the unit cell region to form the PDN region is divided into three subregions.

Therefrom, a first subregion, a second subregion and a third subregion are defined in the unit cell region according to the position from the leftmost (not shown in the drawings).

For this case, the ion doping process is repeated three times in order to form a stepwise impurity concentration profile of the PDN region in accordance with the present invention. This can be achieved by the ion doping process with a constant dopant concentration or a constant energy.

The method of the constant concentration ion doping process is explained as follows. The ion doping process had better be performed three times because the number of the subregions is three.

The first impurity ion doping process with a constant dopant concentration is performed over the three subregions in the unit cell region.

The second impurity ion doping process with the same dopant concentration as the first process is performed over the first and second subregions, as depicted in FIG. 6a.

The third impurity ion doping process with the same dopant concentration as the first process is performed on the first subregion, as depicted in FIG. 6a.

Therefore, in this exemplary embodiment, the three impurity ion doping processes are overlapped for the doped concentration of the first subregion and the two impurity ion doping processes are overlapped for the doped concentration of the second subregion. In the last subregion on the rightmost, the impurity ion doping process is performed only once.

As the result of the three impurity ion doping processes, as depicted in FIG. 6a the doped impurity concentration profile in the PDN region is sequentially shrunk or enlarged according to the repeating number of the ion doping processes. In this profile, the first subregion is used as the first PDN region.

Referring to FIG. 6b, another method to form a doped impurity concentration profile in accordance with the present invention is described as follows.

The first and second regions are also divided into a plurality of subregions, three subregions for this exemplary embodiment. When doping, the ion doping concentration (or the ion doping energy) is different according to the position of the subregion.

In this exemplary embodiment, the ion doping process having the highest concentration (the highest doping energy) is used for the first subregion which is used as the first PDN region.

The ion doping process having the second highest concentration (the second highest doping energy) is used for the second subregion.

The lowest dopant concentration (the lowest doping energy) is used for the leftmost subregion.

The impurity concentration profile for the PDN region is also depicted in FIG. 6b.

It is possible to perform the doping process in reverse sequence according to the position of each subregion so that the leftmost subregion has the lowest impurity concentration and the rightmost subregion has the highest impurity concentration.

It is possible to form the stepwise impurity concentration of the PDN region by using a mask layer with different thickness according to the position of each subregion. In this case, according to the thickness of the mask layer, the PDN region formed in the epitaxial layer 52 has a stepwise ion doped profile.

Thus, after the ion doping process according to the sequence of FIG. 6a or FIG. 6b is completed, the ion doping process is repeatedly performed only for the first region two or three times more so as to define the first PDN region in a perpendicular direction from the surface of the semiconductor substrate. FIG. 6c shows an exemplary embodiment in which a fourth impurity doping process is performed.

The dopant concentration for the case of FIG. 6c may equal or not equal to the dopant concentration for the case of FIG. 6a or FIG. 6b, but it is preferable to use the dopant concentration for the case of FIG. 6c equal to or less than the dopant concentration for the case of FIG. 6a or FIG. 6b.

The ion doping process in FIG. 6c is performed after all the transistors for transferring, sensing and resetting charges are formed.

All the ion doping processes for the first region are performed without making any isolating region in the first region.

According to the photo diode region of the CMOS image sensor of the present invention, charges generated in the PDN region are transferred from the low PDN impurity concentration region to the high PDN impurity concentration region (the first region) since an internal potential level difference is formed in the PDN region by the PDN ion doping process corresponding to the position of each subregion.

In the CMOS image sensor according to the present invention, all the region of the unit cell other than the light shield region by transistors is defined as a light receiving portion since the photo diode is formed up to the lower portion of the active region (the second region) where transistors for transferring, sensing and/or resetting charges are formed in the surface of the active region.

It will be apparent to those skilled in the art that various modifications and variations can be made in the CMOS sensor and the fabrication method of the present invention without departing from the spirit or scope of the invention. Thus, it intended that the present invention covers the modifications and variations of this invention provided they come within the scope of the appended claims and their equivalents.

What is claimed is:

1. A fabrication method of a CMOS image sensor, comprising the steps of:

epitaxially growing a surface of a semiconductor substrate to form an epitaxial layer having a first region and a second region adjacent to the first region;

dividing said first and second regions into a plurality of subregions and then performing a PDN impurity doping process one time or repeatedly as many times as the number of said subregions so that a difference of potential levels between two adjacent subregions according to a sequential order is stepwise;

forming a plurality of transistors for transferring, sensing and resetting charges in the second region; and doping PDN impurity ions into the first region once again.

2. The fabrication method of a CMOS image sensor as claimed in claim 1, wherein an n type semiconductor substrate is used instead of the epitaxial growing process and a p type well is formed by a p type impurity ion doping process on the semiconductor substrate.

3. The fabrication method of a CMOS image sensor as claimed in claim 1, wherein the first PDN region has the highest potential level in the PDN region.

4. The fabrication method of a CMOS image sensor as claimed in claim 1, wherein the first region has the highest impurity concentration or the deepest impurity doping depth.

5. The fabrication method of a CMOS image sensor as claimed in claim 1, wherein a mask layer having a stepwise increasing thickness according to the distance from the first region is formed and thereafter a PDN impurity ion doping process is performed through the mask layer once.

6. The fabrication method of the CMOS image sensor as claimed in claim 1, wherein a plurality of the PDN impurity ion doping processes are repeatedly performed to be most overlapped in the first region of the among said subregions and least overlapped in the subregion farthest from the first region.

7. The fabrication method of the CMOS image sensor as claimed in claim 6, wherein the doping concentration or the doping energy for the PDN impurity ion doping process is kept at a constant level.

8. The fabrication method of a CMOS image sensor as claimed in claim 1, wherein the PDN impurity ion doping process is performed once in the respective subregions and the do ping concentration or the doping energy for the PDN impurity ion doping process varies with the position of the respective subregions.

9. The fabrication method of the CMOS image sensor as claimed in claim 8, wherein the doping concentration or the doping energy is decreased according to the distance from the first region.

10. The fabrication method of the CMOS image sensor as claimed in claim 1, wherein the first region has a uniform impurity ion concentration while all the PDN impurity ion doping processes are performed.

* * * * *